United States Patent [19]
Wu et al.

[11] Patent Number: 6,137,293
[45] Date of Patent: Oct. 24, 2000

[54] MEASURING METHOD FOR EQUIVALENT CIRCUITRY

[75] Inventors: Ruey-Beei Wu; Mei-Hua Wang, both of Taipei, Taiwan

[73] Assignee: Hon Hai Precision Ind. Co., Ltd., Taipei Hsien, Taiwan

[21] Appl. No.: 09/218,108

[22] Filed: Dec. 21, 1998

[30] Foreign Application Priority Data

Dec. 19, 1997 [TW] Taiwan ................................ 86119475

[51] Int. Cl.[7] ............................................. G01R 27/28
[52] U.S. Cl. .......................... 324/638; 324/637; 703/14
[58] Field of Search .................................. 324/637, 638, 324/642, 646, 76.21, 76.24, 76.38; 327/350–354

[56] References Cited

U.S. PATENT DOCUMENTS

| | | | |
|---|---|---|---|
| 4,962,359 | 10/1990 | Dunsmore | 324/638 |
| 5,003,253 | 3/1991 | Majidi-Ahy et al. | 324/754 |
| 5,231,349 | 7/1993 | Majidi-Ahy et al. | 324/754 |
| 5,371,468 | 12/1994 | Pelster | 324/600 |

*Primary Examiner*—Safet Metjahic
*Assistant Examiner*—Vincent Q. Nguyen

[57] ABSTRACT

A measuring method for equivalent circuitry is disclosed herein to characterize the interconnects using time-domain reflectometry measurement. By combining the layer peeling algorithm for transmission lines and the matrix-pencil approach for discontinuities, the technique yields a simple equivalent circuit model which consists of distributed transmission lines and networks of lumped elements. With element values being independent of frequency, the model is well suited to model nonlinear broadband circuit simulation for electrical performance of the interconnects.

16 Claims, 9 Drawing Sheets

MEASURING METHOD FOR EQUIVALENT CIRCUITRY

SPECIFICATION

1. Field of the Invention

The present invention relates to a measuring method and, particularly to a measuring method for detecting electrical characteristics of a system.

2. The Prior Art

Due to the ever increasing clock speed in a high speed digital system, for example a circuit including a CPU, the rise time of signals is considerably reduced. Moreover, low-swing voltage components such as GaAs MOSFETs are popularly used in the digital system, therefore external chip circuitry has a greater affect on the function of the entire system especially concerning efficiency and accuracy. Ideally, interconnects between components and the circuit board should be as short as possible in a low frequency environment. However, as environmental frequencies based on the clock frequency increase, some resulting effects within a high speed transmission line such as reflection, propagation delay, electomagnetic interference, waveform degradation, and cross talk may become more significant during signal transmission and cause malfunction of the system. Such a concern becomes more urgent in view of the advent of devices with lower voltage swing and the development of mixed digital and analog systems.

To investigate the impact of interconnects, it is beneficial to set up an equivalent circuit model so that the devices and interconnects can be properly represented by the circuit simulation. For this purpose, a large variety of measurement techniques have been developed to characterize the interconnects. In the case of small dimensions or low operating frequencies, the interconnects can be approximately modeled by lumped capacitance and inductance. The element values can be accurately obtained by frequency-domain methods or time-domain methods.

As the basic operating frequency becomes higher, the interconnects exhibit significantly distributed characteristics which can not be represented by simple lumped circuits. Although it is common practice for microwave engineers to characterize distributed elements in the frequency domain using the network analyzer, the obtained S parameters are often strongly frequency dependent. For applications in digital circuits, the frequency range of interest extends from dc to high frequencies. It is better to resort to transient simulation, for which the frequency dependent elements should be overlooked to avoid extended simulation time. In this case, the measurement based on time domain reflectometry (TDR) attracts increasing attention and the final equivalent circuit of the simplest SPICE-compatible format is in great demand.

Basically, the interconnects include transmission line sections and discontinuities accompanied by localized magnetic or electrical energy storage. Two approaches have been employed for the interconnect modeling. Based on the layer peeling algorithm for nonuniform transmission lines, the first approach is defined in terms of transmission line elements. Although this will satisfy the transmission line sections, the representation is less efficient in modeling the discontinuities and the algorithm may become unstable. The other approach models the interconnects as networks of multiple poles and devises an interactive scheme for the SPICE-compatible circuit simulation. It is advantageous for discontinuities, but it becomes inconvenient to model the transmission line section of the interconnects. For example, a ladder network of 36 poles is required to model a simple interconnect formed by two microstrip line sections and a bonding wire.

Therefore, the characteristics of the transmission line should be considered before approaching the total layout of the system in order to prevent unwanted interim tests and debugging procedures during configuration of the whole system thereby resulting in cost reduction.

Some conventional techniques may be used to detect discontinuity circuits or contacts of a simple circuit at low frequencies, however, such techniques are not applicable at high frequencies.

In "Extraction of Coupled SPICE Models for Packages and Interconnects", *International Test Conference,* Paper 20.1, pp.1–13, October 1993, S. Diamond and B. Janko has disclosed this technique. This disclosure utilizes TDR response and integrates along the time axis to obtain SPICE-related models of IC contacts including self inductance and self capacitance to ground for a single contact, and mutual inductance and mutual capacitance of multi-contacts. This approach can obtain total inductance and capacitance by integration along the time axis which may be sufficiently accurate for low frequency yet not proper enough for disclosing high frequency characteristics, such as the skin effect, wave distortion, and time delay of the circuit.

A layer peeling transmission line synthesis in the time domain for a noncoupled or coupled transmission line model has been disclosed by S. C. Burkhart and R. B. Wilcox in "Arbitrary Pulse Shape Synthesis via Nonuniform Transmission Lines", *IEEE Trans. Microwiave Theory Tech.,* vol. 38, pp. 1514–1518, October 1990. This technique may be accurate for serial impedance which changes smoothly along different positions. Dozens of equal-length transmission lines must be connected in series for gaining the equivalent model of the circuit if the unknown circuit quickly changes its impedance or if it contains lumped components therein. Since the obtained equivalent circuit contains a plurality of small sections having different impedances, it becomes very cumbersome to either describe the characteristic of the structure under test or proceed with the simulation of the circuit.

Other disclosures discuss obtaining equivalent models of transmission lines relating to microstrips with a 90-degree curve or T-intersection, identical width and arranged in parallel, or lengthwise impedance matching in which the discontinuity is represented by a capacitance resulting from integration of the local impedance over time and inductance resulting from integration of the local admittance over time. The related disclosures are, "Time-Domain Characterization of Interconnect Discontinuities in High-Speed Circuits" by J. M. Jong and V. L. Tripathi, *IEEE Trans. Comp., Hybrid, and Manufact. Technol.,* vol. 15, pp. 497–504, August 1992; "Time-Domain Characterization of Coupled Interconnects and Discontinuities", by J. M. Jong, L. A. Hayden and V. L. Tripathi, *IEEE MTT-S Digest,* 1994; and "Time Domain Characterization and Circuit Modeling of a Multilayer Ceramic Package", by J. M. Jong, B. Janko, and V. L. Tripathi, *IEEE Trans. Comp., Packaging, and Manufact. Technol.—Part B,* vol. 19, pp. 48–55, February 1996. The methods as mentioned may overcome the disadvantage of the layer peeling extraction algorithm, however, the high frequency characteristic of the discontinuity region cannot be accurately approached.

For circuitry which cannot be simulated as a pure transmission line, reference can be made to "Interconnect Characterization Using Time-Domain Reflectometry", by S. D.

Corey and A. T. Yang, *IEEE Tans. Microwave Theory Tech.,* vol. 43, pp. 2151–2156, September 1995. Corey introduces an extraction approach for obtaining a pulse response mode of an unknown circuit. This approach firstly converts the measured response of the TDR/TDT into an S parameter of the time domain and then obtains the equivalent model of the main circuit. The main model comprises an equivalent impedance and a current source. However, the resulting extraction cannot distinguish or limit generation of the non-physical poles, i.e. sometimes the complex real portion of the pole S is positive which will cause difficulties in analysis of the transient status, and the real portion S will diverge along the time axis.

SUMMARY OF THE INVENTION

The objective of the present invention is to provide a measuring method for obtaining characteristics of an equivalent circuit of a transmission line system for use in simulating and predicting the effects of the circuit so as to execute debugging and amendments during design procedures thereby reducing cost.

Another objective of the present invention is to provide a measuring method for obtaining broadband circuit response characteristic of discontinuities of the circuit for extracting a suitable circuit model thereof.

A further objective of the present invention is to provide a new measuring method using the time domain measuring manner to obtain an equivalent circuit of a transmission line so as to predict the circuitry characteristics thereof A first aspect of the present invention is to provide a measuring method for obtaining equivalent circuitry comprising the following steps: (1) applying an input voltage to a device under test (DUT), detecting a reflected signal from the DUT, and separating the reflected signal into at least one smooth transmission line section and a lumped circuit section; (2) converting the input voltage and the reflected signal into an incident wave and a reflected wave, respectively; (3) obtaining the characteristic impedance of the transmission line section via layer peeling transmission line synthesis and also obtaining the incident wave and reflected wave of the subsequent lumped circuit section; (4) obtaining a reflected step response from the incident wave and the reflected wave; (5) converting the step response obtained from the lumped circuit into an electrical circuit; (6) obtaining an incident wave and a reflected wave existing in subsequent sections of the transmission line; (7) repeating steps 3 to 6 until the characteristic impedance and the electrical circuit relating to each section of the reflective signal are obtained.

A second aspect of the present invention is to provide a measuring method which integrates an equivalent circuit extraction method, a lumped circuit modeling extraction method, and a matrix pencil method for extracting finite models to reduce inaccuracies caused by calculating errors.

A third aspect of the present invention is to provide a measuring method which utilizes a time domain reflection measurement (TDR), a time domain transmission measurement (TDT) and a suitable circuit extraction method for extracting an equivalent model of the transmission line, which in turn is simulated and expressed by SPICE for further simulation when combined with another circuit.

A fourth aspect of the present invention is to provide a measuring method for extracting an equivalent circuit from an electrical connector to obtain characteristics of the discontinuities or interconnects of the electrical connector.

A fifth aspect of the present invention is to provide a measuring method which can obtain an equivalent circuit from an electrical connector wherein the equivalent circuit has simplified electrical components thereby reducing the time required to perform the circuit simulation.

DETAILED DESCRIPTION OF THE PREFERRED EMBODIMENTS

Figure 1:
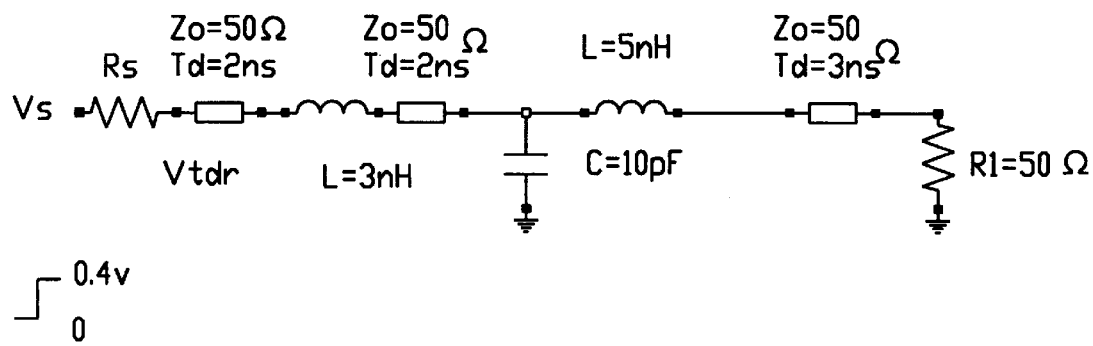
FIG. 1 is a simulated transmission line used for a measuring method of equivalent circuitry.
Figure 2:
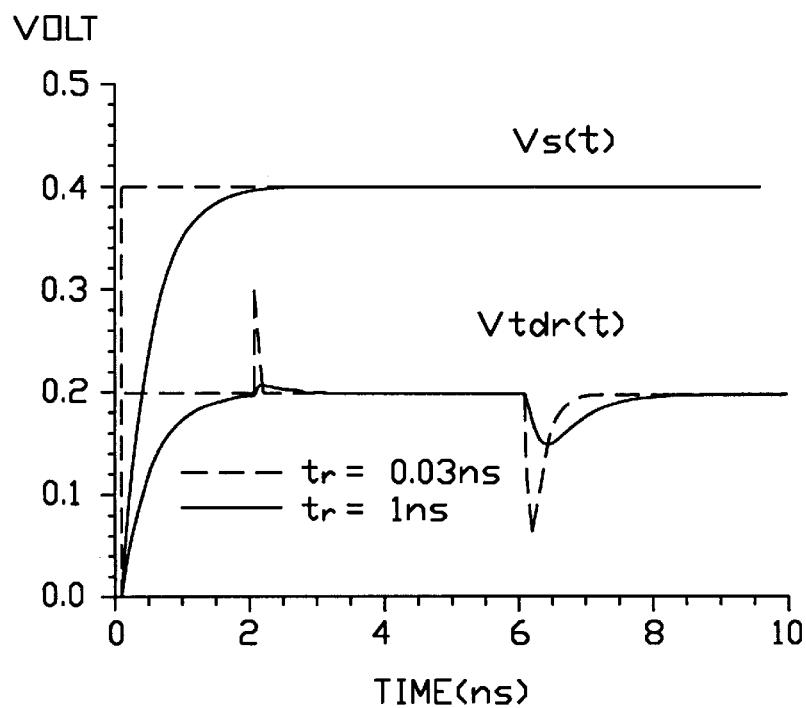
FIG. 2 is a time domain response, wherein the solid line and the phantom line represent different responses of different input signals Vs(t)

Referring to FIG. 1, a simulated transmission line model in accordance with the present invention is shown to measure the related parameters of a transmission line, wherein Vs and Rs respectively represent the input voltage and the equivalent resistance of the time domain analyzer. In this embodiment, the input voltage Vs is step input of 0.4 voltage. When the input voltage Vs is input into the device under test (DUT), i.e., the simulated transmission line of FIG. 1, a reflected signal Vtdr is obtained as shown in FIG. 2. Specifically, the reflected signal Vtdr may be of two forms, wherein the solid form of the Vtdr results from the solid line of input signal Vs while the phantom line form of Vtdr results from the phantom line of input signal Vs. The solid line form and phantom line form of the input signal Vs differ from each other in rising time.

The equivalent circuit may be obtained by the following steps. Firstly, converting $V_{tdr}(t)$, $V_s(t)$ to incident wave $a_1$ and reflected wave $b_1$ via equations (1) and (2) as listed hereunder. Secondly, obtaining the characteristic impedance value $Z_i$ of each transmission line section via a layer peeling algorithm. Actually, the obtained characteristic impedance value $Z_i$ is an average value within the section of the transmission line. $TD_j$ is half of the response time of the preceding section of the transmission line adding the response time of the subsequent lumped component. Incident wave $a_{j+1}$ and reflected wave $b_{j+1}$, are respectively the incident wave and reflected wave of the subsequent lumped component.

A non-uniform characteristic impedance transmission line is separated into N+1 equal length of sections of transmission line with uniform impedance. Each section has a characteristic impedance $Z(x)$, the current and voltage of which are $I(x,t)$ and $V(x,t)$. For analysis, the current and voltage signals are expressed by a sum of the incident wave and the reflected wave as listed in equations (1) and (2).

$$a(x,t) = \frac{1}{2}\left[\frac{V(x,t)}{\sqrt{Z(x)}} + I(x,t)\sqrt{Z(x)}\right] \quad (1)$$

$$b(x,t) = \frac{1}{2}\left[\frac{V(x,t)}{\sqrt{Z(x)}} - I(x,t)\sqrt{Z(x)}\right] \quad (2)$$

Figure 3:
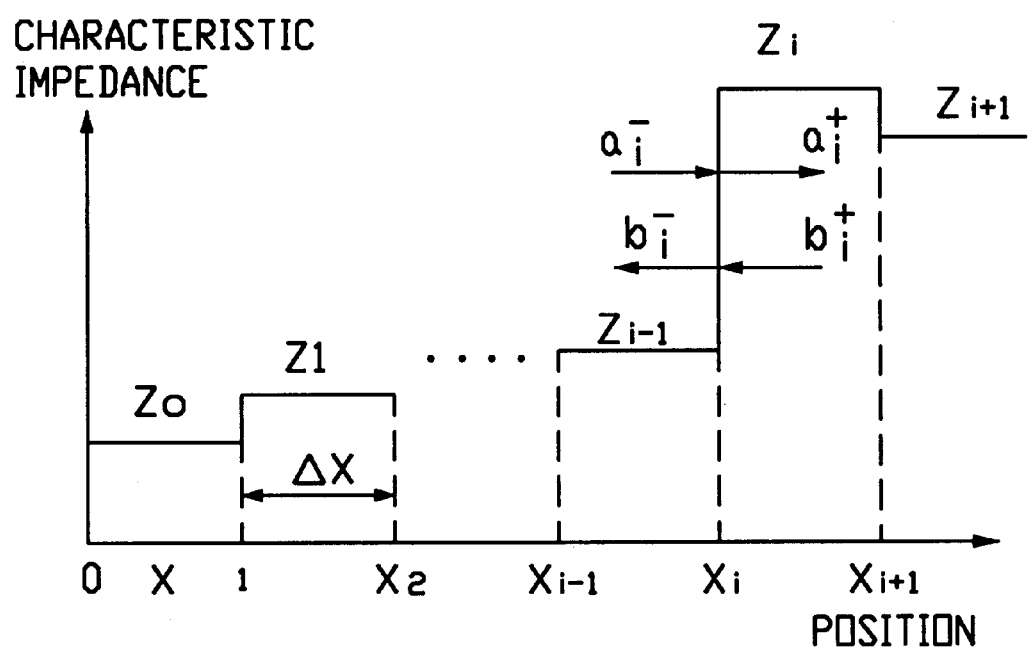
FIG. 3 is a layer peeling algorithm used in different sections of a transmission line.

Referring to FIG. 3, at each interconnect of the transmission line, $a_i^+$ is the incident wave at position of $x_1+\epsilon$; $a_i^-$ is the incident wave at position of $x_i-\epsilon$, wherein $\epsilon$ is proximate to zero ($\epsilon \to 0$). The reflected wave $b_i^+$ and $b_i^-$ have the same definition with respect to $\epsilon$ similar to the incident wave.

For the voltage and current which are continuous at $x=x_i$, $$\sqrt{Z_{i-1}}(a_i^- + b_i^-) = \sqrt{Z_i}(a_i^+ + b_i^+) \quad (3)$$
$$\sqrt{Z_i}(a_i^- - b_i^-) = \sqrt{Z_{i-1}}(a_i^+ - b_i^+)$$

where i=1, 2, 3, ..., N.

The reflection coefficient is defined as:

$$S_i = \frac{Z_i - Z_{i-1}}{Z_i + Z_{i-1}} \quad (4)$$

It can be induced that the incident wave and reflected wave $a_i^+$ and $b_i^+$ at the position $x=x_i$ are in the matrix form:

$$\begin{bmatrix} a_i^+ \\ b_i^+ \end{bmatrix} = \frac{1}{\sqrt{1-S_i^2}} \begin{bmatrix} 1 & -S_i \\ -S_i & 1 \end{bmatrix} \begin{bmatrix} a_i^- \\ b_i^- \end{bmatrix} \quad (5)$$

Suppose at the position $x=x_1$, the voltage $V(t)$ and the current $I(t)$ can be obtained via measurement by the time domain analyzer, then the incident wave and the reflected wave may be defined as functions with piecewise constants as follows:

$$a_1^- = \frac{1}{2}\left[\frac{V(2(j-1)\Delta t)}{\sqrt{Z_0}} + I(2(j-1)\Delta t)\sqrt{Z_0}\right], \quad (6)$$
for $2(j-1)\Delta t \leq t < 2j\Delta t$ $$b_1^- = \frac{1}{2}\left[\frac{V(2(j-1)\Delta t)}{\sqrt{Z_0}} - I(2(j-1)\Delta t)\sqrt{Z_0}\right], \quad (7)$$
for $2(j-1)\Delta t \leq t < 2j\Delta t$ where j=1, 2, 3, ..., N, and $\Delta t = \Delta w/v$, while v is the wave propagation velocity.

Next, the incident wave and the reflected wave with respect to both time and position can be simplified as:

$$a_{i,j}^- = a(w=i\Delta w - \epsilon, t=(i+2(j-1))\Delta t))$$

$$a_{i,j}^+ = a(w=i\Delta w + \epsilon, t=(i+2(j-1))\Delta t))$$

$$b_{i,j}^- = a(w=i\Delta w - \epsilon, t=(i+2(j-1))\Delta t))$$

$$b_{i,j}^+ = a(w=i\Delta w + \epsilon, t=(i+2(j-1))\Delta t)) \quad (8)$$

Wherein $\epsilon$ is proximate to zero ($\epsilon \to 0$). These denotations separate the transmission line into sections of electrical length $\Delta t$, wherein section $\Delta t$ has the same characteristic impedance. The time-dependent incident wave and reflected wave are determined in each section of electrical length of $2\Delta t$, wherein the measured value of the incident wave (or reflected wave) at any measuring point of the same section ($2\Delta t$) is identical. The reflected wave at junction $w=w_{i+1}$, will only reach the time domain analyzer after the previous reflected wave at junction $w=w_i$ has reached the time domain analyzer for a time period of $2\Delta t$.

Therefore equation (5) can be rewritten as:

$$\begin{bmatrix} a_{i,j}^+ \\ b_{i,j}^+ \end{bmatrix} = \frac{1}{\sqrt{1-S_i^2}} \begin{bmatrix} 1 & -S_i \\ -S_i & 1 \end{bmatrix} \begin{bmatrix} a_{i,j}^- \\ b_{i,j}^- \end{bmatrix} \quad (9)$$

Suppose there is no initial DC voltage applied to the transmission line, then $b_{i,1}^+ = 0$ by which equation (9) can be simplified as:

$$S_i = \frac{b_{i,1}^-}{a_{i,1}^-} \quad (10)$$

Finally, consider the incident wave and the reflected wave respectively at junctions $w=w_i$ and $w=w_{i+1}$:

$$a_{i+1,j}^- = a_{i,j}^+, \text{ for } j=1, 2, 3, \ldots, N-i$$

$$b_{i+1,j}^- = b_{i,j}^+, \text{ for } j=1, 2, 3, \ldots, N-i \quad (11)$$

Equation (11) clearly shows that the wave (incident or reflected) propagates a distance of $\Delta x$ in a section with impedance of $Z_i$, wherein the propagated distance is merely related to the time period $\pm \Delta t$ ($-\Delta t$ for incident wave and $+\Delta t$ for reflected wave).

In conclusion, the extraction of an impedance profile from a transmission line to which no initial DC voltage is applied includes the following steps:

I. Initially the impedance $Z_i = Z_0$, i=1, the incident wave $a_1^-$ and the reflected wave $b_1^-$ may be obtained by equations with piecewise constants as shown in expressions (6) and (7).

II. $S_i$ can be obtained from equation (10), and $Z_i$ can be obtained by inserting the obtained $S_i$ into equation (4).

III. Insert the obtained $S_i$ into equation (9) and obtain the incident and reflected waves $a_{i,j}^+$ and $b_{i,j}^+$ at any time period in the ith section of the transmission line, where j=1, 2, 3, ..., N+1-i.

IV. Obtain the incident and reflected waves $a_{i+1,j}^-$ and $b_{i+1,j}^-$ in the next section using equation (11).

V. Increase i by 1 (i=i+1) and repeat steps (II) to (V) until i=N, then $Z_i$ (i=1, 2, ..., N ) will be the characteristic impedance of each section.

If a step voltage source $V_S$ is input into the system then the reflected signal $V_{tdr}$ can be obtained, accordingly the current $$I = \frac{V_S - V_{tdr}}{Z_0}.$$

The impedance profile, the incident wave, and the reflected wave can all be obtained by the above steps.

The impedance profile in a uniform transmission line can be obtained via steps I and II, wherein the region in which the impedance is much greater than that of the adjacent region can be treated as a lumped component section. The lumped component can be analyzed via step III in which the incident and reflected waves $a_j$, $b_j$, are inserted into equation (23) to obtain a reflective coefficient impulse response $s_{im}$, and into equations (24) and (25) to obtain a reflective coefficient step response s(t) which will be explained later.

Instead of direct explanation, a step-like waveform Fourier transform is introduced herein:

For obtaining S parameters in discontinuities, the incident and reflected waves must experience a fast Fourier transform (FFT). However, it is difficult to apply an FFT on the voltage source $V_S(1)$ and the reflected signal $V_{tdr}(t)$ without resulting in high frequency components. This is because the voltage source $V_S(t)$ has to be digitized to N points and made in cycles. If there are obvious discontinuities in $V_S((N-1)\Delta t)$ and $V_S(N\Delta t)$, application of an FFT on the periodic signals will result in high frequency components.

Figure 4A:
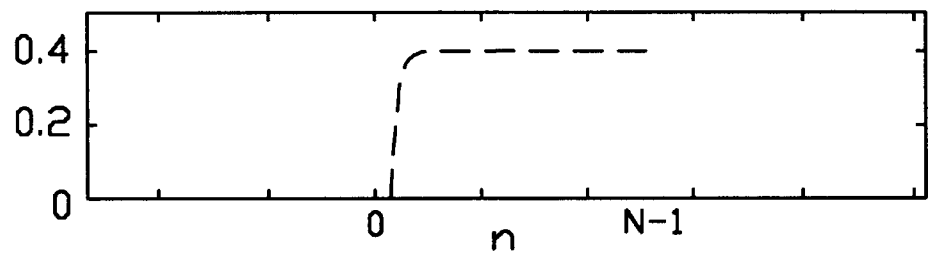
FIG. 4A is a time domain response wherein the horizontal axis represents the sampling number and the vertical axis represents the voltage.
Figure 4B:
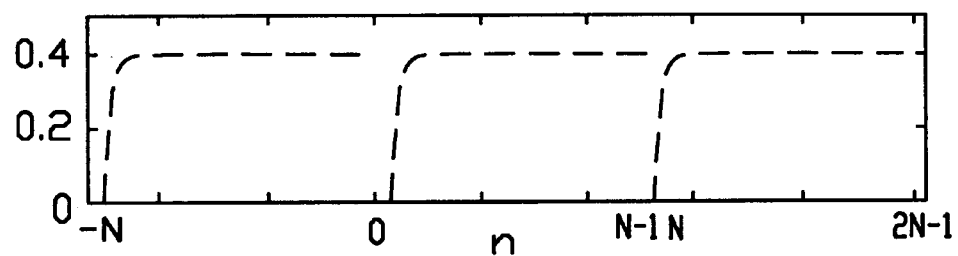
FIG. 4B shows cycles of step input signals.

By the following method, the frequency response of the step-like signal $V_{tdr}(n\Delta t)$ can be obtained. Referring to FIG. 4A, $f(t)$ is a step-like function, time axis ranging from 0 to T, defining g(t) as example in FIG. 4B, then g(t=2T)=g(t=0) is a continuously periodic function:

$$g(t) = \begin{cases} f(t) & , 0 \le t \le T \\ f(T) - f(t-T)u(t-T) & , T \le t \le 2T \end{cases} \quad (12)$$

wherein u(t-T) is a unit step function and the Fourier transformation of g(t) may be expressed as:

$$G(f) = F(f)(1 - \exp(-j2\pi fT)) \quad (13)$$

wherein F(f) is a Fourier transformation of $f(t)$. The frequency $f$ can be digitized into $k\Delta f$, wherein $\Delta f = 1/(2T)$ is a fundamental frequency, while the spectrum G(f) of g(t) can be digitized into:

$$G(k\Delta f) = \begin{cases} 2F(k\Delta f) & , k = \pm 1, \pm 3, \pm 5, \cdots \\ 0 & , k = \pm 2, \pm 4, \pm 6, \cdots \\ \text{don't care} & , \text{otherwise} \end{cases} \quad (14)$$

The inverse Fourier transformation cannot be achieved without the unit step signal. However, the unit step signal will extend unlimitedly therefore the average value thereof is difficult to obtain. To solve this, let the step input source g(i) have a cycle T during TDR measurement, then $$F(0) = G(0)$$

Finally rearrange the new defined FFT pair as:

$$g(n\Delta t) = \quad (15)$$
$$\begin{cases} f(n\Delta t) & , n = 0, 1, 2, 3, \ldots, N-1 \\ f((N-1)\Delta t) - f((n-N)\Delta t) & , n = N, N+1, N+2, \ldots, 2N-1 \end{cases}$$

$$F(k\Delta f) = \begin{cases} FFT[g(n\Delta t)]/2 & , k = 1, 3, 5, \ldots, 2N-1 \\ FFT[g(n\Delta t)] & , k = 0 \end{cases} \quad (16)$$

Wherein FFT[ ] represents a normal FFT transformation and N is the total number of sampling points.

A lumped component (circuit) constituting resistors, inductors, and capacitors can be represented by one or more linear constant-coefficient differential equations. Therefore, the impulse response of this circuit represented by S parameter can be expressed as:

$$s_{im}(t) = b_0\delta(t) + b_1 e^{p_1 t} + \ldots + b_M e^{p_M t}, \text{real}(p_i) \le 0 \quad (17)$$

Wherein each $b_i$ is a residue of the expression, each $p_i$ is a pole of the transfer function, and M is the mode number.

Considering the distributed circuit, theoretically, there should be an infinite number of modes. However, for a finite bandwidth, the S parameter of the simulated circuit may be represented by a finite number of modes M. Moreover, the function $\delta(t)$ has an infinite bandwidth which does not exist in the practical measurement, therefore, the S parameter of the circuit can be simplified as:

$$s_{im}(t) = b_1 e^{p_1 t} + b_2 e^{p_2 t} + \ldots + b_M e^{p_M t} \quad (18)$$

From steps I and II, the incident and reflected waves can be obtained:

$$a(t) = \frac{1}{2}\left(\frac{V_{tdr}(t)}{\sqrt{Z_0}} + I(t)\sqrt{Z_0}\right) \quad (19)$$

$$b(t) = \frac{1}{2}\left(\frac{V_{tdr}(t)}{\sqrt{Z_0}} - I(t)\sqrt{Z_0}\right) \quad (20)$$

The incident wave a and the reflected wave b are sampled at every $\Delta t$ interval and then digitized as:

$$a(n) = \frac{V_S(n)}{2\sqrt{Z_0}} \quad (21)$$

$$b(n) = \frac{1}{2\sqrt{Z_0}}[2V_{tdr}(n) - V_S(n)] \quad (22)$$

Experiencing the FFT and result in $$S_{11}(k) = S_{11}(k\Delta f) = \frac{B(k\Delta f)}{Z(k\Delta f)} = \frac{FFT[b(n)]}{FFT[a(n)]} \quad (23)$$

Converting the frequency domain parameter into the time domain parameter and $s_{im}(t) = s_{11}(n\Delta t) = s_{11}(n)$ is obtained. Using input source with finite bandwidth still causes a $\delta(t)$ at t=0. If using equation (18) for equivalence, the mode number M will be definitely greater than one. Applying an additional low pass filter with a cutoff frequency of $V_S$ to proceed filtering on $s_{11}(n)$ is based on the fact that $A(k\Delta f)$ and $B(k\Delta f)$ are approximated to zero at high frequencies. By division, $S_{11}(k\Delta f)$ will be approximated to 1 or greater than 1. However, $s_{11}(s)$ will increase q poles after this filtering, wherein q is the order of the filter.

For reducing the mode number and fully utilizing the TDR measurement characteristic (the reflected wave b(n) obtained from the TDR response is a step response), the step response $s_s(i)$ of s is defined as:

$$s_s(t) = \int_0^T s_{im}(\tau) d\tau \quad (24)$$

Suppose the subsequent matching impedance of the DUT is 50Ω, then the step response at infinite time will be zero:

$$\lim_{t \to 0} s_s(t) = 0 \quad (25)$$

The reflective coefficient impulse response $s_{im}$ and the reflective coefficient step response $s(t)$ can be obtained from step III. Using step IV and the matrix pencil method, the mode number M, the residues $b_i$ and the poles $p_i$ (i=1, 2, . . . , M) can be obtained.

Mathematically, if two functions are combined by a parameter, for example $f(t)+zg(t)$, then the combined function is called a pencil of function from $f$ and $g$ with a parameter $z$. Similarly, this idea is also useful for a matrix, for example, $Y_2 - zY_1$, then the combined matrix is called a matrix pencil. Therefore, the mode of a lumped circuit can be extracted by using the matrix-pencil approach.

For a transient state, the information of the sampled points can be referred to as the reflective coefficient step response:

$$s(k) = \sum_{i=1}^{M} b_i z_i^k, \quad z_i^k = \exp(p_i k \Delta t) \quad (26)$$

Wherein k=0, 1, 2, . . . , N−1, N is number of sampled points, M is the mode number, $b_i$ is the residue of the conjugate of the $_i$ mode (also called complex coefficient of the mode), $p_i$ represents one of the poles of the mode, Δt is sampling interval, and $z_i$ represents one of the poles in the Z-plane. If $s(k)$ is a function of real value, then for those complex poles, $b_i$ and $p$ are each complex conjugate pairs.

Considering the following information vectors:

$$y_0, y_1, y_2, \ldots, y_L$$

$$y_i = [s(i), s(i+1), s(i+2), \ldots, s(i+N-L-1)]^T \quad (27)$$

Wherein the symbol T represents a transpose of the matrix. The above vectors can be arranged as two matrices $Y_1$ and $Y_2$ respectively represented as:

$$Y_1 = [y_0, y_1, y_2, \ldots, y_{L-1}]$$

$$Y_2 = [y_1, y_2, y_3, \ldots, y_L] \quad (28)$$

Rearrange $Y_1$, $Y_2$ and obtain:

$$Y_1 = Z_1 B Z_2$$

$$Y_2 = Z_1 B Z_0 Z_2 \quad (29)$$

wherein $$Z_1 = \begin{bmatrix} 1 & 1 & \ldots & 1 \\ z_1 & z_2 & \ldots & z_M \\ \vdots & \vdots & \ldots & \vdots \\ z_1^{N-L-1} & z_2^{N-L-1} & \ldots & z_M^{N-L-1} \end{bmatrix} \quad (29)$$

$$Z_2 = \begin{bmatrix} 1 & z_1 & \ldots & z_1^{L-1} \\ 1 & z_2 & \ldots & z_2^{L-1} \\ \vdots & \vdots & \ldots & \vdots \\ 1 & z_M & \ldots & z_M^{L-1} \end{bmatrix} \quad (30)$$

$$Z_0 = \text{diag}[z_1, z_2, z_3, \ldots z_M]$$

$$B = \text{diag}[b_1, b_2, b_3, \ldots, b_M] \quad (32)$$

Based on the matrix decomposition of the matrices $Y_1$ and $Y_2$, it can be determined that the poles {$z_i$; i=1, 2, 3, . . . , M} in the Z plane are the eigenvalues of the matrix $Y_2 - zY_1$ if M≦L≦N−M. For example, if the matrices $Y_1$, $Y_2$ each have a rank of M, then the rank of the combined matrix $Y_2 - zY_1$ will decrease by one when z is one of $z_i$.

Normally, the sampled point number is greater than 2M. For the unknown mode number situation, the sampled point number should be sufficient. For obtaining the eigenvalue z, the following is defined:

$$Y_1^+ Y_2 = Z_2^+ B^{-1} Z_1^+ Z_1 B Z_0 Z_2 = Z_2^+ Z_0 Z_2 \quad (33)$$

Wherein the superscript "+" represents a pseudo-inverse matrix, while "−1" is used for a normal-inverse matrix.

Therefore, there are n vectors {$p_i$; i=1, 2, 3, . . . , M} which causes $$Y_1^+ Y_1 p_i = p_i \quad (34)$$

and $$Y_1^+ Y_2 p_i = z_i p_i \quad (35)$$

where $p_i$ is an eigenvector for $Y_2 - zY_1$ with respect to $z_i$.

Utilizing singular value decomposition (SVD) to decompose $Y_1$ and obtain the pseudo-inverse matrix $Y_1^+$ $$Y_1 = \sum_{i=1}^{M} \sigma_i u_i v_i^H = UDV^H \quad (36)$$

$$Y_1^+ = VD^{-1} U^H \quad (37)$$

Wherein U=[$u_1, u_2, u_3, \ldots, u_M$], V=[$v_1, v_2, v_3, \ldots, v_M$], D=diag[$\sigma_1, \sigma_2, \sigma_3, \ldots, \sigma_M$], superscript H represents conjugate transpose, U and V respectively represent unitary matrix for diagonalizing matrix $Y_1 Y_1^H$ and $Y_1^H Y_1$ and D is a matrix of singular value, wherein elements in the diagonal line are singular values while others at either side of the diagonal line are zero.

The calculated $s(k)$ normally includes high frequency interference which has to be removed. To remove the high frequency interference, the largest M singular values $\sigma_1 \geq \sigma_2 \geq \sigma_3 \geq \ldots \geq \sigma_M$ of $Y_1$ have to be determined. Other singular values are treated as interference signals designated as $\sigma_{M+1} \sigma_{M+2} = \ldots = \sigma_N = 0$, wherein M is the mode number for $s(k)$. Insert equation (37) into equation (35):

$$(D^{-1} U_H Y_2 V - z_i I) V^H p_i = 0 \quad (38)$$

From above, the eigenvalue $z_i$ and the residue $p_i$ can be obtained. From the obtained eigenvalue $z_i$, the matrix $Z_1^+$ can be obtained. The mode number $b_i$ can be obtained from the information vector $y_0$, and the obtained $Z_1^+$.

$$B = Z_1 y_0 \quad (39)$$

For extracting the limited mode number M, a determination standard of the present invention follows $\sigma_{M'+1} < \sigma_1/30$. Firstly, determine the mode number M'. Secondly, use the largest M coefficients (the absolute value) $|b_i|$ and the corresponding poles $p_i$ as the coefficients and poles of the required mode when $$|b_{M+1}| < 0.1 \max_{i=1}^{M}[|b_i|].$$

After obtaining the mode number M, corresponding residues $b_i$ and poles $p_i$ are obtained by means of the matrix-pencil approach. For the purpose of simulating circuit, the obtained parameters should be converted into simulated circuit. Therefore, in step V of the present invention, an equivalent circuit synthesis is employed to obtain the value of the related circuit.

From the time domain measurement, it can be found that the voltage (reflected wave) increases at the discontinuity position due to the inductance discontinuity effect, while the voltage (reflected wave) decreases at the discontinuity position due to the conductance discontinuity effect.

Figure 5:
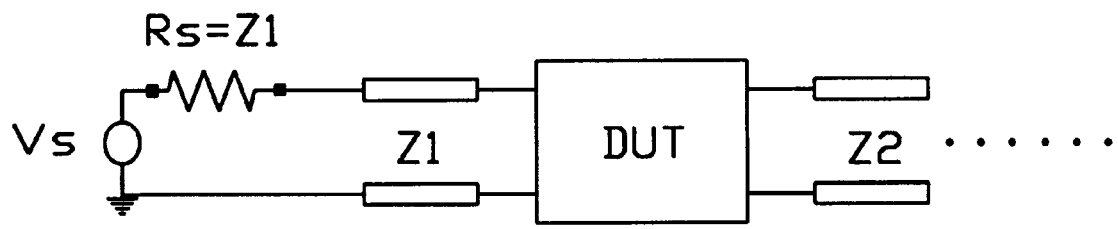
FIG. 5 shows a schematic device for measuring a TDR response.
Figure 6A:
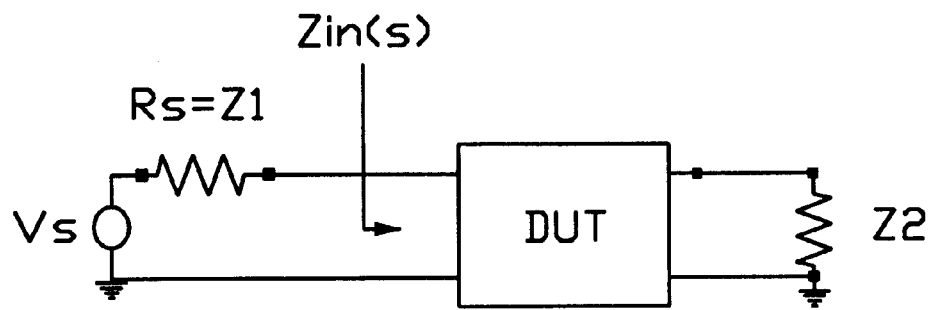
FIG. 6A illustrates an equivalent measuring circuit from which the uniform transmission line has been removed.

Referring to FIG. 5, a circuit arrangement for measuring the TDR response with a TDR analyzer is shown. Since the uniform transmission line connected to the DUT will only affect the TDR response in the time domain delay, the transmission line can be omitted and simplified as shown in FIG. 6A, wherein $V_S$ is a unit step voltage source. A TDR response to this circuit arrangement is designated as $V_{tdr}$ herein.

Figure 6B:
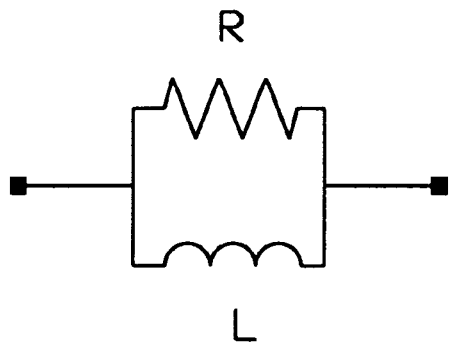
FIG. 6B illustrates the inductance element of the real-valued pole.
Figure 6C:
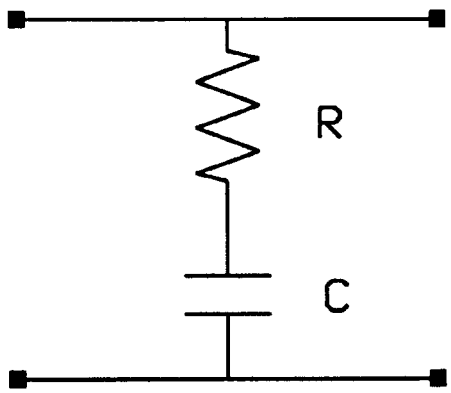
FIG. 6C illustrates the capacitance element of the real-valued pole.
Figure 6D:
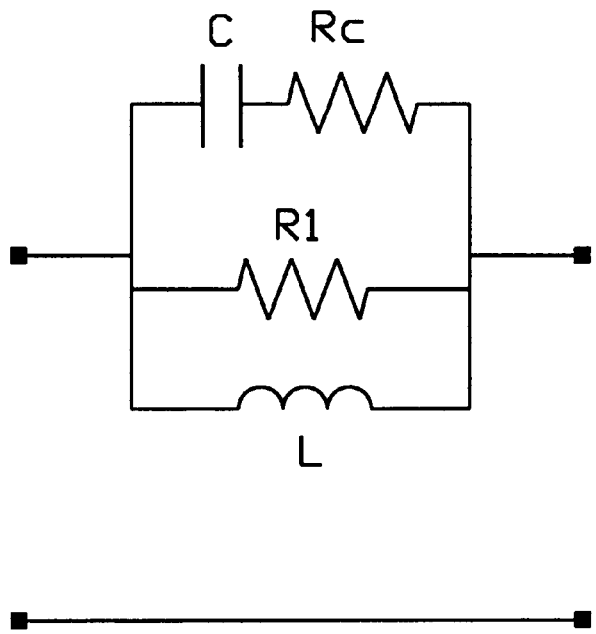
FIG. 6D illustrates the cascade element of the complex-valued pole.
Figure 6E:
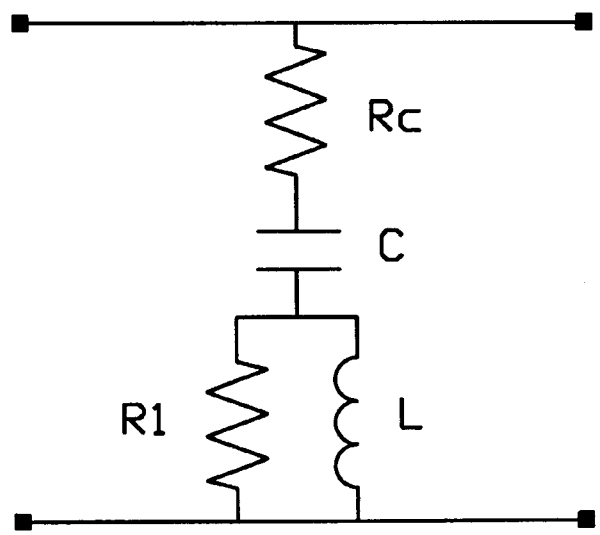
FIG. 6E illustrates the parallel element of the complex-valued pole.

For an electrical connector, the DUT is fully conductive in a stable DC state. Therefore, some simulated circuit configurations can be assumed to be reasonable. The simulated circuit configuration refers to FIGS. 6B and 6C when the transformation function includes real poles and to FIGS. 6D and 6E when the transformation includes complex poles. This equivalent circuit causes no loss in the DUT during DC status.

Assume $Z_{in}(s)$ (s-domain impedance) is the impedance as viewed from the incident end:

$$Z_{in}(s) = \frac{V_{tdr}(s)}{I(s)} = Z_1 \frac{V_{tdr}(s)}{V_S(s) - V_{tdr}(s)} \quad (40)$$

then $$\lim_{s \to 0} Z_{in}(s) = Z_2 \quad (41)$$

which is the characteristic impedance at the right side of the DUT.

Define the reflective coefficient of the DUT to be:

$$H(s) \equiv \frac{V_{tdr}(s) - V_{tdr,0}(s)}{V_i(s)} \quad (42)$$

wherein $V_{tdr,0}$ is the TDR response without the DUT and $$V_i(s) \equiv \frac{V_S(s)}{2}$$

the incident voltage. Since $$V_{tdr}(s) = \frac{Z_{in}}{Z_{in} + Z_i} V_S(s) \text{ and}$$

$$V_{tdr,0}(s) = \frac{Z_2}{Z_1 + Z_2} V_S(s),$$

then:

$$H(s) = 2\left[\frac{Z_{in}}{Z_{in} + Z_1} - \frac{Z_2}{Z_1 + Z_2}\right] \quad (43)$$

It shows that $$\lim_{s \to 0} H(s) = 0,$$

therefore the DC component of the time domain response of the DUT defined above is approximated to zero.

Referring to equation (24), the step response of the DUT can be defined as:

$$s_s(s) \equiv \frac{1}{s} H(s) \quad (44)$$

Conversely, converting $s_s(s)$ into the time domain function will result in the form similar to the right side of equation (18). The expression $s_s(s)$ can be exhibited in other form:

$$s_s(s) \cong \sum_{i=1}^{M} \frac{b_i}{s + p_i} \quad (45)$$

Referring to equations (40), (41) and (42) and obtaining:

$$Z_{in}(s) = Z_1 \frac{\frac{Z_2}{Z_1 + Z_2} + \frac{sS(s)}{2}}{\frac{Z_1}{Z_1 + Z_2} - \frac{sS(s)}{2}} \quad (46)$$

Considering the real pole and the complex pole of equation (46): A、 Real poles $b_i$ and gi are real values, then equation (46) can be changed to (47) by referring to equation (41):

$$Z_{in}(s) = \frac{Z_2 + \sum_{i=1}^{M} c_i s^i}{1 + \sum_{i=1}^{M} d_i s^i} = Z_2 + s \sum_{i=1}^{M} \frac{h_i}{s + g_i} \quad (47)$$

By partial division, $Z_{in}(s)$ can be separated as:

$$Z_{in}(s) = s \underbrace{\sum_{\substack{i=1 \\ h_i > 0}}^{N} \frac{h_i}{s + g_i}}_{I} + s \underbrace{\sum_{\substack{i=N \\ h_i < 0}}^{P} \frac{h_i}{s + g_i}}_{II = Z_{in}^P(s)} + Z_2 \quad (48)$$

Wherein N+P=M, $h_i > 0$ in section I, while $h_i < 0$ in section II.

Figure 7A:
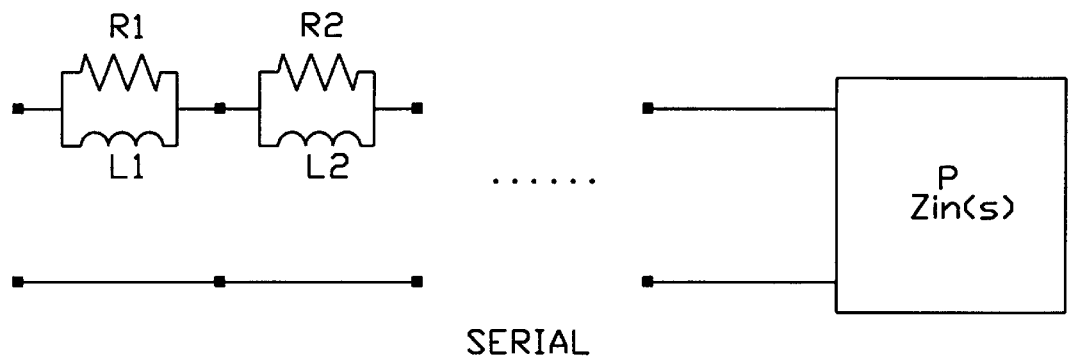
FIG. 7A illustrates the equivalent circuit of the cascaded inductance components of the real-valued pole in accordance with the present invention.

I. Consider section I ($h_i > 0$ in equation (48), the equivalent circuit is shown in FIG. 7A which is composed of a plurality of inductors connected in series. The resistance and inductance of the components are expressed as:

$$R_i = h_i, \quad L_i = \frac{R_i}{g_i} \tag{49}$$

Figure 7B:
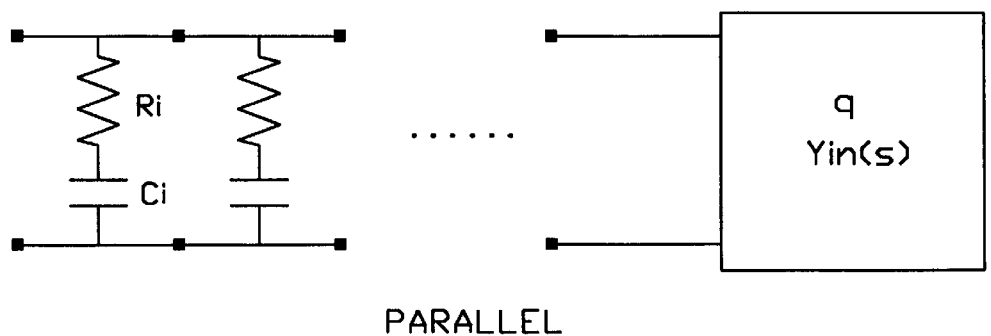
FIG. 7B illustrates the equivalent circuit of the parallel capacitance components of the real-valued pole in accordance with the present invention.

II. Consider section II ($h_i<0$ in equation (48), the equivalent circuit is shown in FIG. 7B which is composed of a plurality of capacitors connected in parallel. For obtaining the parameters of the component, the input is defined as:

$$Y_{in}^P(s) \equiv \frac{1}{Z_{in}^P(s)} = \frac{1}{Z_2 + s\sum_{i=1}^{P}\frac{h_i}{s+g_i}} = \frac{1 + \sum_{i=1}^{P} d_i s^i}{Z_2 + \sum_{i=1}^{P} c_i s^i} \tag{50}$$

Decompose equation (50) into:

$$Y_{in}^P(s) = \frac{1}{Z_2} + s\sum_{i=1}^{P}\frac{k_i}{s+m_i} \tag{51}$$

All the terms with $k_i>0$ may be a component of the equivalent circuit of FIG. 7B. The resistance and capacitance thereof may be expressed as:

$$R_i = \frac{1}{k_i}, \quad C_i = \frac{1}{m_i R_i} \tag{52}$$

The left terms with $k_i<0$ in equation (51) should be inverted to obtain the equivalent impedance. The procedure of equation (48) and steps I and II should be repeated until the M circuit elements are obtained.

B、Complex poles $b_i$、$g_i$ are complex conjugate pairs and equation (45) can be expressed as:

$$S(s) \cong \sum_{i=1}^{M/2}\frac{b_i}{s+p_i} + \frac{b_i^*}{s+p_i^*} = \sum_{i=1}^{M/2}\frac{b_{1i}s+b_{0i}}{s^2+p_{1i}s+p_{0i}} \tag{53}$$

Equation (46) can be expressed as:

$$Z_{in}(s) = Z_2 + s\sum_{i=1}^{M/2}\frac{q_i s + h_i}{s^2 + k_i s + m_i} \tag{54}$$

$$= s\underbrace{\sum_{i=1}^{N/2}\frac{q_i s + h_i}{s^2 + k_i s + m_i}}_{\text{III}} + s\underbrace{\sum_{i=1}^{P/2}\frac{q_i s + h_i}{s^2 + k_i s + m_i}}_{\text{IV}} + Z_2$$

Wherein $q_i$、$h_i$、$k_i$、$m_i$ are real values, N+P=M, $h_i>0$ in section III $h_i<0$ in section IV.

III. Consider section III, the equivalent circuit of the inductance element of FIG. 7A can be replaced by the cascade poles of FIG. 6D, the parameters are:

$$L_i = \frac{h_i}{m_i}, \quad R_{L_i} = \frac{h_i}{k_i - \frac{q_i}{L_i}} \tag{55}$$

-continued $$R_{C_i} = \frac{1}{\frac{1}{q_i} - \frac{1}{R_{L_i}}}, \quad C_i = \frac{R_{L_i}}{h_i(R_{L_i} + R_{C_i})}$$

IV. Consider section IV ($h_i<0$), the parallel capacitors of FIG. 7B are replaced by the parallel poles of FIG. 6E. The input conductance is defined as:

$$Y_{in}^P = \frac{1}{Z_{in}^P(s)} = \frac{1}{Z_2 + s\sum_{i=1}^{P/2}} = s\sum_{i=1}^{P/2}\frac{v_i s + r_i}{s^2 + u_i s + n_i} + \frac{1}{Z_2} \tag{56}$$

Wherein $v_i$, $y_i$, $u_i$, $n_i$ are real values and the component values are:

$$C_i = \frac{r_i}{n_i}, \quad R_{C_i} = \frac{1}{r_i}\left(u_i - \frac{v_i}{C_i}\right) \tag{57}$$

$$R_{L_i} = \frac{1}{v_i} - R_{C_i}, \quad L_i = \frac{R_{L_i} \cdot v_i}{C_i \cdot n_i}$$

In equation (56), the terms with $r_i<0$ should be inverted to obtain the equivalent impedance. In equation (54), sections III and IV should be repeated until $M/2$ circuit elements are obtained.

The primary purpose of step V is to convert the characteristic parameter of the system into an equivalent circuit.

For obtaining the incident wave and the reflected wave of subsequent sections of the uniform transmission line, step VI is employed, in which the transformation matrix is applied to obtain the incident wave and the reflected wave of the subsequent section of the uniform transmission line.

Figure 8:
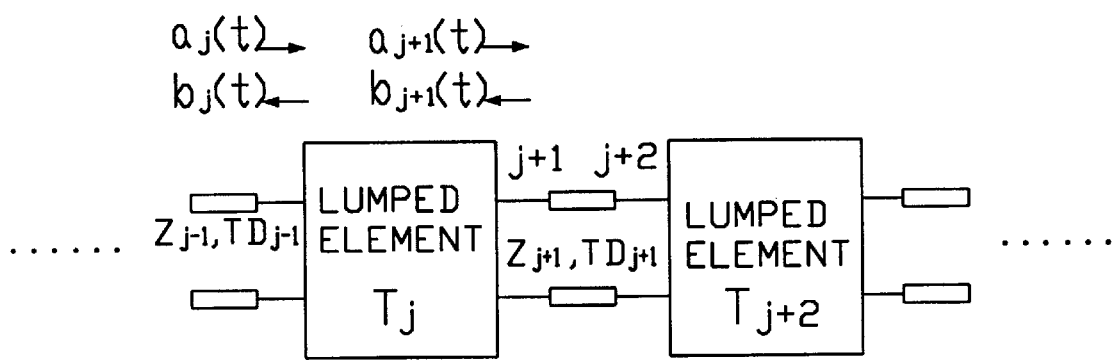
FIG. 8 is a hybrid equivalent model of the present invention.

Referring to FIG. 8, assume the lumped element at point j is known by its incident wave and reflected wave $a_j(i)$, $b_j(i)$. Defining vector:

$$\begin{bmatrix} a_j(t) \\ b_j(t) \end{bmatrix}, \quad 0 \leq t < T_j$$

Wherein $T_j$ is the TDR response time of the lumped element section.

Applying the FFT to obtain $$\begin{bmatrix} a_j(t) \\ b_j(t) \end{bmatrix} \rightarrow \begin{bmatrix} A_j(k\Delta f) \\ B_j(k\Delta f) \end{bmatrix} \tag{58}$$

wherein $0 \leq t < T_j$, k=0, 1, 2, 3, . . . , $$\Delta f = \frac{1}{T_j}$$

Referring to equations (19) and (20), the matrix expression of the incident wave and the reflected wave relating to point j can be defined as a combination of voltage and current parameters:

$$\begin{bmatrix} A_j \\ B_j \end{bmatrix} = \frac{1}{2\sqrt{Z_{j-1}}}\begin{bmatrix} 1 & Z_{j-1} \\ 1 & -Z_{j-1} \end{bmatrix}\begin{bmatrix} V_j \\ I_j \end{bmatrix} = [M_j]\begin{bmatrix} V_j \\ I_j \end{bmatrix} \tag{59}$$

The voltage/current relation between the incident end of the lumped element and the subsequent uniform transmission line can be expressed as:

$$\begin{bmatrix} V_{j+1} \\ I_{j+1} \end{bmatrix} = \begin{bmatrix} A & B \\ C & D \end{bmatrix} \begin{bmatrix} V_j \\ I_j \end{bmatrix} = [W_j] \begin{bmatrix} V_j \\ I_j \end{bmatrix} \quad (60)$$

Wherein $[W_j]$ (ABCD matrix) is determined by the mode obtained from step V.

Therefore, the incident wave at point j+1 can be determined:

$$\begin{bmatrix} A_{j+1} \\ B_{j+1} \end{bmatrix} = [M_{j+1}][W_j]^{-1}[M_j]^{-1} \begin{bmatrix} A_j \\ B_j \end{bmatrix} = [T_j] \begin{bmatrix} A_j \\ B_j \end{bmatrix} \quad (61)$$

wherein $[T_j]=[M_{j+1}]=[W_j]^{-1}[M_j]^{-1}$ is the transformation matrix of the lumped element section. Applying the previous IFFT, the incident and reflected waves a, and $b_{j+1}$ of a subsequent transmission line section can be obtained:

$$\begin{bmatrix} A_{j+1}(k\Delta f) \\ B_{j+1}(k\Delta f) \end{bmatrix} \rightarrow \begin{bmatrix} a_{j+1}(t) \\ b_{j+1}(t) \end{bmatrix}, 0 \le t < T \quad (62)$$

The equivalent circuit of the transmission line system can be extracted by repeating steps II, III, IV, V and VI.

The present invention is a hybrid peeling extraction method for extracting equivalent circuits in interconnects of transmission lines in an electrical/mechanical system which especially includes connectors for electrical connection between two circuit elements. The hybrid layer peeling extraction method comprises two methods: (1) layer peeling extraction method of transmission lines and (2) mode extraction method. The layer peeling extraction method of transmission lines can achieve satisfactory extracting effect for uniform transmission lines while the mode extraction method can extract the equivalent circuit for lumped element (hybrid circuit).

Figure 9:
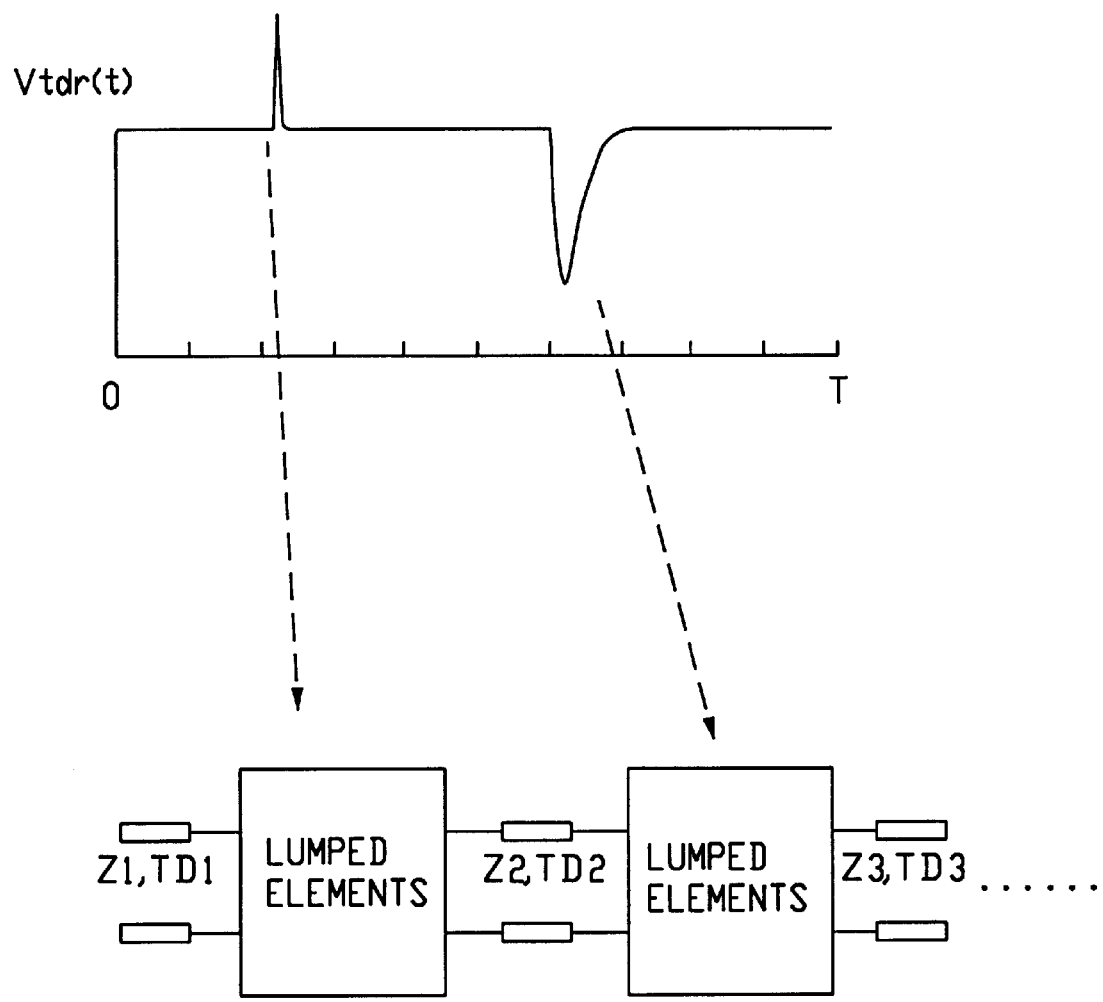
FIG. 9 is a sectional schematic view of the hybrid equivalent model.

TDR response $V_{tdr}$ can be separated alternately into transmission line sections and lumped element sections together including k sections as shown in FIG. 9. Assume the first section is a transmission line section, then the extraction steps of the present invention comprise:

I. Converting $V_{tdr}(t)$ and $V_s(t)$ into incident wave $a_1$ and reflected wave $b_1$ by means of equation (1) and (2).

II. Obtaining the characteristic impedance $Z_i$ of the transmission line section by means of the layer peeling extraction method, wherein the obtained impedance $Z_i$ is an average value, and $TD_j$ is the average of the response time of the leading transmission line and the response time of the subsequent lumped element section. The incident wave $a_{j+1}$ and the reflected wave $b_{j+1}$ are obtained and they are respectively the incident wave and reflected wave of the subsequent lumped element.

III. For the lumped element section, the reflection coefficient impulse response $s_{im}$ can be obtained by inserting the incident and reflected waves $a_j$ and $b_j$ into equation (23), while the reflection coefficient step response s(t) can be obtained by inserting the incident and reflected waves $a_j$ and $b_i$ into equations (24) and (25).

IV. Obtaining mode number M, residues $b_i$, and poles $p_i$, i=1, 2, . . . , M by matrix pencil method.

V. Obtaining the parameter values of the equivalent circuit of the lump element by equivalent circuit synthesis.

VI. Utilizing the transpose matrix of the lumped element section to obtain the incident and reflected waves of the subsequent uniform transmission line.

Repeating steps II、III、IV、V、VI until k sections of equivalent circuit are extracted.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A measuring method for equivalent circuitry comprising the following steps: (1) applying an input voltage to a device under test (DUT), detecting a reflected signal from the DUT, and separating the reflected signal into at least one uniform transmission line section and at least one lumped element section;

(2) converting the reflected signal and the input voltage into a reflected wave and an incident wave, respectively;

(3) obtaining characteristic impedance of the uniform transmission line section via layer peeling transmission line synthesis and also the incident wave and reflected wave of the subsequent lumped element section;

(4) obtaining a reflected step response from the incident wave and the reflected wave;

(5) converting and simulating the step response obtained from the lumped element section into a simulated electrical circuit;

(6) obtaining from the simulated electrical circuit next incident wave and next reflected wave which enter subsequent uniform transmission line section; and (7) repeating steps (3) to (6) until the characteristic impedance and the simulated electrical circuit relating to each section of the reflected signal are obtained.

2. The measuring method as claimed in claim 1, wherein the reflected signal obtained in step (1) experiences a rectifying procedure.

3. The measuring method as claimed in claim 2, wherein a portion of the DUT at which the variation of the reflected signal is below a predetermined level is defined as a uniform transmission line section.

4. The measuring method as claimed in claim 3, wherein the step (5) applies a matrix pencil method on the obtained step response to obtain a mode number, residues, and poles which are then converted into the simulated electrical circuit.

5. The measuring method as claimed in claim 4, wherein the step (5) applies a transpose matrix of the lumped element section to obtain the incident wave and reflected wave of a subsequent uniform transmission line section.

6. The measuring method as claimed in claim 5, wherein the obtained step response is converted into the simulated electrical circuit by an equivalent circuit synthesis.

7. The measuring method as claimed in claim 2, wherein the reflected signal in step (1) is obtained by a time domain reflection.

8. The measuring method as claimed in claim 7, wherein the mode number M, the absolute value of the residue $|b_i|$ and a coefficient α together meet a relation expression $$|b_{M+1}| < \overset{M}{\underset{i=1}{a}} \cdot \text{Max}[|b_i|].$$

9. The measuring method as claimed in claim 8, wherein the coefficient α is 0.1.

10. A measuring method for equivalent circuitry comprising the following steps:

(1) applying an input voltage into a device under test (DUT) and obtaining a reflected signal;

(2) converting the input voltage and the reflected signal into an incident wave and a reflected wave, respectively;

(3) obtaining a reflected coefficient step response from the incident wave and the reflected wave and obtaining a mode number M, residues $b_i$, and poles $p_i$ by means of matrix pencil method; and (4) converting the DUT into an electrical circuit based on the obtained mode number M, the residues $b_i$ and the poles $p_i$.

11. The measuring method as claimed in claim 1, wherein the reflected signal obtained in step (1) experiences a rectifying procedure.

12. The measuring method as claimed in claim 10, wherein a portion of the DUT at which the variation of the reflected signal is below a predetermined level is defined as a uniform transmission line section.

13. The measuring method as claimed in claim 10, wherein at step (2) a transpose matrix of the lumped element is applied to obtain the incident wave and reflected wave of subsequent transmission line sections.

14. The measuring method as claimed in claim 10, wherein the reflected signal is obtained at step (1) by means of a time domain reflection.

15. The measuring method as claimed in claim 10, wherein the mode number M, the absolute value of the residue $|b_i|$ and a coefficient a together meet a relation expression $$|b_{M+1}| < \overset{M}{\underset{i=1}{a}} \cdot \text{Max}[|b_i|].$$

16. The measuring method as claimed in claim 15, wherein the coefficient α is 0.1.

* * * * *